United States Patent
Reed

(10) Patent No.: US 6,864,428 B2
(45) Date of Patent: Mar. 8, 2005

(54) ELECTRONIC PACKAGE HAVING FASTENER PARTICLE CONTAINMENT AND ASSEMBLY METHOD

(75) Inventor: Thurman R. Reed, Indianapolis, IN (US)

(73) Assignee: Delphi Technologies, Inc.

( * ) Notice: Subject to any disclaimer, the term of this patent is extended or adjusted under 35 U.S.C. 154(b) by 62 days.

(21) Appl. No.: 10/613,174

(22) Filed: Jul. 3, 2003

(65) Prior Publication Data

US 2005/0000715 A1 Jan. 6, 2005

(51) Int. Cl.$^7$ ................................................ H03G 3/00
(52) U.S. Cl. ............... 174/100; 174/102 R; 174/138 R; 174/135
(58) Field of Search ............................ 174/100, 102 R, 174/138 R, 138 E, 135

(56) References Cited

U.S. PATENT DOCUMENTS

| | | | |
|---|---|---|---|
| 4,568,899 A | * | 2/1986 | May et al. .................... 335/18 |
| 6,538,543 B2 | | 3/2003 | Bircann et al. |
| 6,558,596 B1 | * | 5/2003 | Bienick et al. ............. 264/154 |

* cited by examiner

Primary Examiner—Dean A. Reichard
Assistant Examiner—Jinhee Lee
(74) Attorney, Agent, or Firm—Stefan V. Chmielewski

(57) ABSTRACT

An electronic package includes a first housing member, a second housing member engaging the first housing member to form an enclosure, and electronic circuitry located within the enclosure. The electronic package also includes holes provided in the housing, and thread-forming fastener screws for engaging the holes to fasten together the first and second housing members. The electronic package further includes a particle containment pad adjacent to each hole for collecting any particles, such as metal shavings, formed during engagement of the fastener screw within the hole.

14 Claims, 2 Drawing Sheets

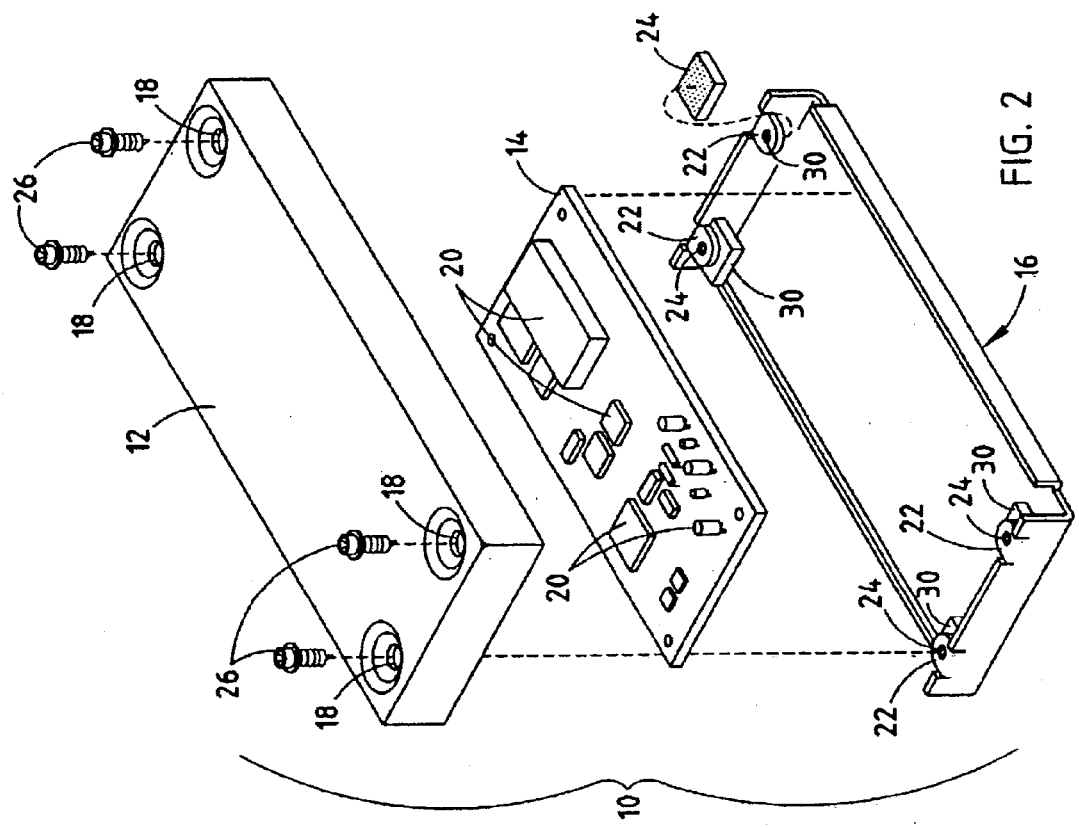
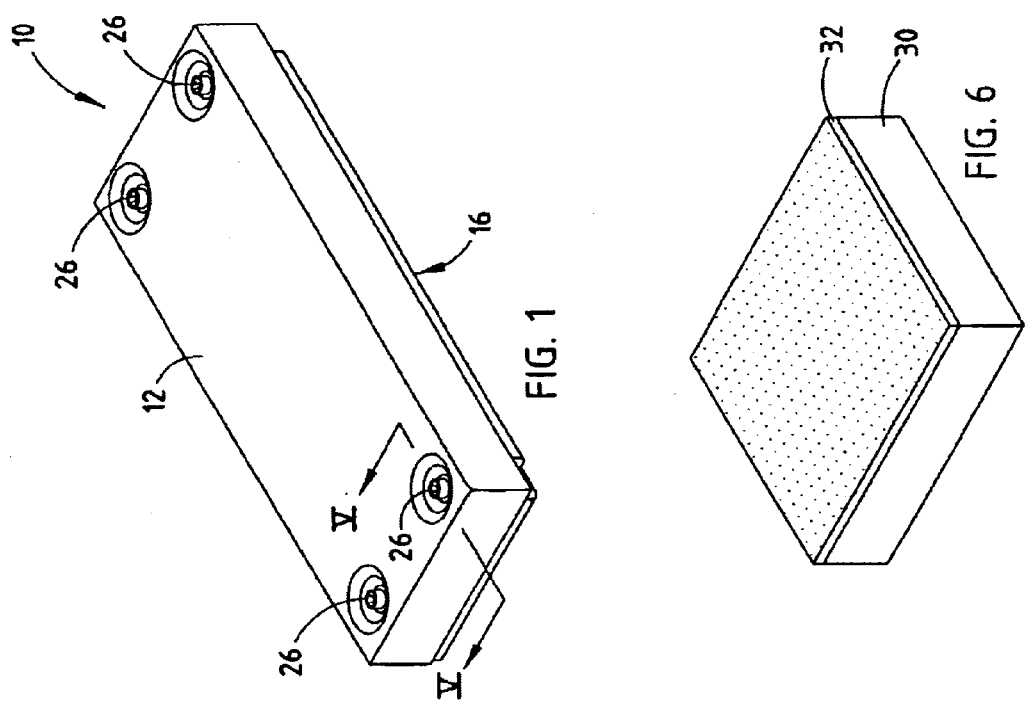

ELECTRONIC PACKAGE HAVING FASTENER PARTICLE CONTAINMENT AND ASSEMBLY METHOD

TECHNICAL FIELD

The present invention generally relates to the packaging of electronic components and, more particularly, to an electronic package having a screw fastener.

BACKGROUND OF THE INVENTION

Electronic components are typically packaged within an enclosure to protect the electronic components from adverse environmental exposure. The need to protect electronic packages is even more evident in adverse environmental conditions such as those typically experienced when used in automotive vehicle applications. Electronic package housings typically includes a metal case having a bottom wall and four side walls, and a cover fastened to the metal case, or top and bottom covers assembled to a case having three side walls and a front plate fastened to the case. Many electronic packages typically includes one or more printed circuit boards having electrical circuitry and other components, all generally contained within the housing.

The metal case and one or more covers forming the housing are typically fastened together by a plurality of fastener screws. The assembly of the case and cover(s) typically includes forming threads in the inner wall of a hole, such as an extruded hole, formed in a bracket, tab, or wall connected to one of the case and cover, and driving the fastener screws through the corresponding holes to fasten the cover(s) to the case. The holes are typically non-tapped holes which initially do not have threading. The self-threading screw, which may include tri-lobular, plastite or forming screws, forms a threaded inner side wall within the extrudued hole as the screw is driven through the smaller diameter hole material creating the thread engagement of the fastener and securing the joint of the two materials.

The self-threading forming fastener screws are generally known to produce particles, commonly referred to as slivers or shavings, which are formed due to the force and friction caused by the driving of the self-threading forming fastener screw through the reshaped extruded hole. The metal shavings are generally disposed in the housing and remain within the enclosure of the housing. The presence of metal particles in the housing may cause electrical short circuiting of electrical circuitry, such as the circuitry present in the electronic components. Electrical short circuiting may result in product failure. Electrical circuit shorting may occur initially following assembly of the electronic package or may occur at some later time in the near or distant future.

It is therefore desirable to provide for an electronic package that prevents the disposal of metal particles within a fastened housing containing electronic components to eliminate the possibility of any electrical short circuiting problems. In particular, it is desirable to provide for an electronic package having a housing with self-threading forming fastener screws that prevents metal shavings from contacting electrical circuitry within the housing.

SUMMARY OF THE INVENTION

In accordance with the teachings of the present invention, an electronic package is provided which includes a housing and electronic circuitry located within the housing. Also provided are first and second members and a hole formed in at least one of the first and second members. A fastener screw engages the hole to fasten the first member to the second member. The electronic package further includes a particle containment pad disposed adjacent to the hole for collecting any particles formed during engagement of the fastener screw within the hole. In one embodiment, the fastener screw is a self-threading screw. According to a further aspect of the invention, the first and second members are housing members that form the housing.

According to another aspect of the present invention, a method of assembling an electronic package is provided The method includes the steps of providing a housing and electrical circuitry within the housing, providing first and second members, and forming a hole in at least one of the first and second members. The method also includes the steps of providing a particle containment pad adjacent to the hole, and driving a fastener screw into the hole such that any particles formed during the driving step are collected in the particle containment pad.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is a perspective view of an electronic package having a two-part housing employing a particle containment pad according to the present invention;

FIG. 2 is an exploded view of the electronic package shown in FIG. 1;

FIG. 6 is a perspective view of the particle containment pad according to one embodiment.

DESCRIPTION OF THE PREFERRED EMBODIMENT

Figure 3:
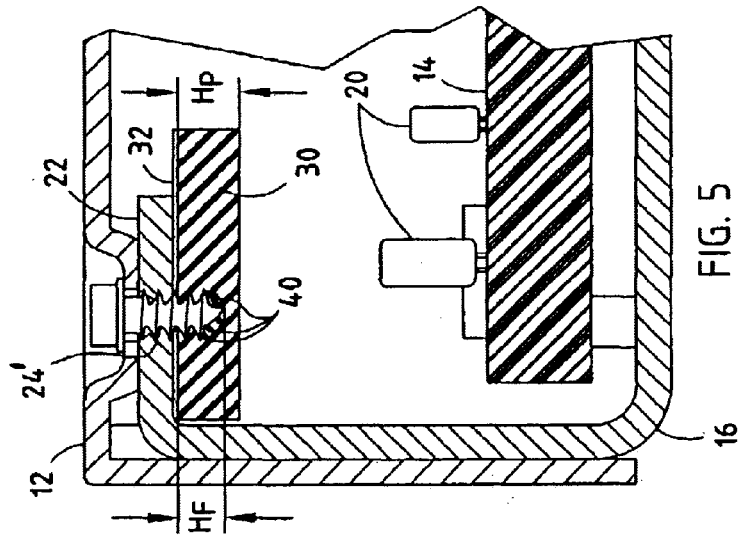
FIG. 3 is a cross-sectional view of a portion of the electronic package taken through lines V—V during assembly.

Referring to FIG. 1, an electronic package 10 is generally illustrated having an upper housing member 12 fastened to a bottom housing member 16 via a plurality of fasteners 26. The electronic package 10 as shown and described herein includes electrical circuitry, such as printed circuits and a plurality of electrical circuit components, contained within a housing enclosure formed by housing members 12 and 16. The fasteners 26 are self-threading fastener screws.

The electronic package 10 is further illustrated in greater detail in FIG. 2. The upper housing member 12 is a metal cover that includes an upper surface and side walls forming the top and side walls of an enclosure. Formed in the top wall of housing cover 12 are a plurality of recessed holes 18 that are configured to receive fastener screws 26.

The lower housing member (case) 16 is a metal case that includes a bottom wall and side walls. Additionally, lower housing member 16 includes brackets 24 which extend inward from the upper edges of the side walls. Formed in each of brackets 22 is a non-threaded hole 24 for receiving one of fastener screws 26. The non-threaded holes 24 are initially formed without any grooves or threading. The holes 24 may include extruded holes or non-extruded holes. The non-threaded holes 24 receive larger diameter self-threading fastener screws 26 which form internal grooves or threading during the assembly process. The screws 26 may include thread-forming or cutting screws. During the self-threading process, the inner wall in brackets 27 forming holes 24 are reshaped to form the grooves and may form metal particles, such as slivers, from either of fastener screw 26 or bracket 22.

Enclosed within the electronic package 10 is a circuit board; such as printed circuit board 14. The printed circuit board 14 may have exposed electrical circuitry formed thereon. Additionally, the printed circuit board 14 includes a number of electrical circuit components 20 fabricated thereon as should be evident to those skilled in the art. Electrical components 20 may include any of a number of passive and active electrical circuit components known in the art. As should be evident to those skilled in the art, the electrical circuit components generally include electrical circuitry that may be exposed on the surface of the printed circuit board and/or electronic components.

The present invention is designed to prevent the deposit of metal particles in contact with the electrical circuitry so as to prevent damage to electrical circuitry and the circuit components which may otherwise be caused by metal shavings. In order to prevent the disposal of metal shavings into contact with the electrical circuitry, the present invention employs a particulate containment pad 30 positioned adjacent to each of holes 24 formed in brackets 22. The particulate containment pad 30 is a soft pliable pad that is penetrable by the fastener screw 26 and has a depth sufficient to receive the bottom end of fastener screw 26 and any particles formed during the self-threading process.

Figure 4:
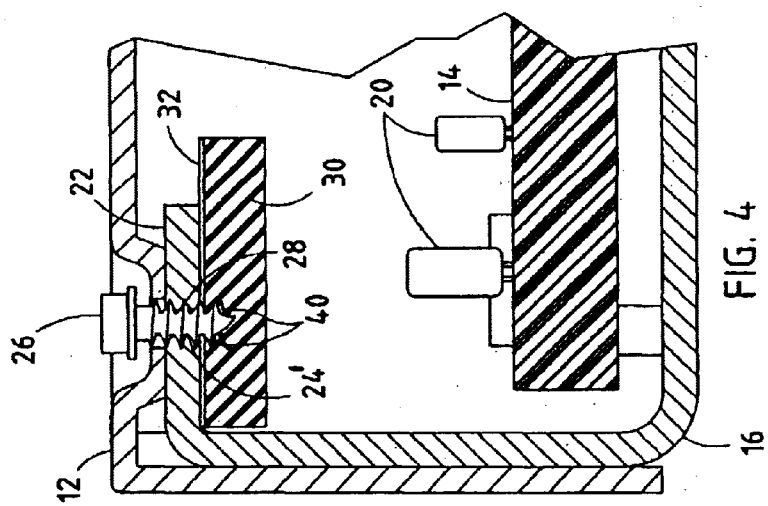
FIG. 4 is a cross-sectional view of the electronic package taken through lines V—V during assembly.
Figure 5:
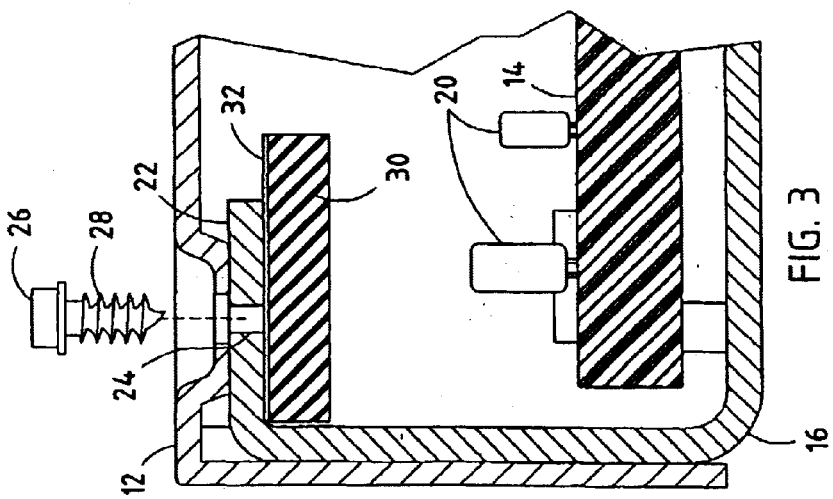
FIG. 5 is a cross-sectional view of the assembled electronic package taken through lines V—V.

The particle containment trap pad 30 is shown in FIGS. 3 through 5 adhered to the bottom surface of bracket 22 below hole 24 via an adhesive layer 32. The adhesive layer 32 may include any of a number of known adhesives such as Scotch laminating adhesive No. 9692, commercially available from 3M, and having a thickness in the range of about 0.002–0.005 inches, according to one example.

The particle containment pad 30 may include a foam or rubber pad. The particle containment pad 30 may include a polymeric pad made of polyvinylchloride (PVC), vinyl foam, Poron urethane foam, or silicone, according to some examples. The pad 30 could be molded with grooves to slip over tabs which may further prevent rotation and be better secured to bracket 22. In addition to molding, the particle containment pad 30 could be dipped in a liquid solution or injected with polymeric material (e.g., plastic).

As seen in FIGS. 4 and 5, the fastener screw 26 extends into opening 24 in bracket 22 to form a threaded opening and a secure connection of housing members 12 and 16. As the fastener screw 26 is driven through non-threaded hole 24, the non-threaded hole 24 becomes a threaded hole 24'.

During this self-threading process, metal particles 40, such as slivers or shavings, may be formed as a by-product of the self-threading process. The metal particles 40 may be shavings from the fastener screw 26 and/or the bracket 22 as the threaded hole 24' is formed. The metal particles 40 may be carried with the fastener screw 26 into the particle containment pad 30 which extends below bracket 22. Due to the extended height $H_p$ of the particle containment pad 30 exceeding the height of the fastener $H_F$, the metal particles 40 are contained within pad 30 and do not become exposed to the electrical circuitry 20 within the enclosure.

Referring to FIG. 6, the particle containment pad 30 is shown according to one embodiment having adhesive layer 32 formed on top thereof. The particle containment pad 30 is shown having a rectangular configuration. However, it should be appreciated that the particle containment pad 30 may be configured in any of a number of shapes and sizes, provided that the pad 30 is soft and of sufficient depth and width to adhere to a surface and contain the metal particles that may be formed during the thread forming process. Accordingly, the electronic package 10 of the present invention advantageously eliminates or reduces the presence of metal filings or shavings within an electronic package which could otherwise adversely affect the electrical circuitry.

While the electronic package 10 is shown and described herein in connection with a fastener screw 26 engaging a hole 24 in first and second housing members 12 and 16, it should be appreciated that the fastener screw 26 may extend into a hole 24 formed in any of first and second members having a particle containment pad 30 disposed adjacent to the hole 24 for containing particles 40. For example, the first and second fastened members may include brackets provided within the housing.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. An electronic package comprising:
   a housing;
   electronic circuitry located within the housing;
   a first member;
   a second member;
   a hole formed in at least one of the first and second members;
   a fastener screw engaging the hole to fasten the first member to the second member; and
   a particle containment pad disposed adjacent to the hole said pad to be penetrated by the fastener screw and collects particles formed during engagement of the fastener screw within the hole to discourage exposure to the electronic circuitry.

2. The electronic package as defined in claim 1, wherein the first and second members comprise first and second housing members forming the housing.

3. The electronic package as defined in claim 1, wherein the hole is non-threaded and the fastener screw is a self-threading screw, wherein the self-threading screw forms a threaded hole.

4. The electronic package as defined in claim 1, wherein the particle containment pad comprises a polymeric pad.

5. The electronic package as defined in claim 4, wherein the polymeric pad comprises a rubber pad.

6. The electronic package as defined in claim 1, wherein the particle containment pad is adhered to a surface.

7. The electronic package as defined in claim 1, wherein the hole is formed in a bracket.

8. The electronic package as defined in claim 1 further comprising a printed circuit board located within the housing, wherein the electronic circuitry is provided on the printed circuit board.

9. An electronic package comprising:
   a first housing member;
   a second housing member engaged with the first housing member to form a housing;

a hole formed in at least one of the first and second housing members;

a fastener screw engaging the hole to fixedly engage the first housing member to the second housing member; and a particle containment pad disposed adjacent to the hole said pad to be penetrated by the fastener screw and collects particles formed during engagement of the fastener screw within the hole to discourage exposure to the electronic circuitry.

10. The electronic package as defined in claim 9, wherein the fastener screw is a self-threading screw that forms a threaded hole.

11. The electronic package as defined in claim 9, wherein the particle containment pad comprises a polymeric pad.

12. The electronic package as defined in claim 9, wherein the particle containment pad is adhered to a surface.

13. The electronic package as defined in claim 9 further comprising a printed circuit board located within the housing, wherein the electronic circuitry is provided on the printed circuit board.

14. The electronic package as defined in claim 9, wherein the first and second housing members comprise a metal case and cover.

* * * * *